United States Patent

Inaba et al.

[11] Patent Number: 5,876,272
[45] Date of Patent: Mar. 2, 1999

[54] SEMICONDUCTOR WAFER POLISHING MACHINE

[75] Inventors: Takao Inaba; Masaaki Oguri; Kenji Sakai, all of Mitaka, Japan

[73] Assignee: Tokyo Seimitsu Co., Ltd., Tokyo, Japan

[21] Appl. No.: 885,870

[22] Filed: Jun. 30, 1997

[30] Foreign Application Priority Data

Jul. 12, 1996 [JP] Japan .................................. 8-183324

[51] Int. Cl.⁶ .............................. B24B 5/00; B24B 29/00
[52] U.S. Cl. .......................... 451/285; 451/288; 451/289
[58] Field of Search .................................. 451/283, 285, 451/286, 287, 288, 289

[56] References Cited

U.S. PATENT DOCUMENTS

| 5,081,795 | 1/1992 | Tanaka et al. | 451/288 |
| 5,584,746 | 12/1996 | Tanaka et al. | 451/288 |
| 5,584,751 | 12/1996 | Kobayashi et al. | 451/288 |
| 5,588,902 | 12/1996 | Tominaga et al. | 451/285 |
| 5,643,048 | 7/1997 | Iyer | 451/288 |
| 5,643,053 | 7/1997 | Shendon | 451/288 |
| 5,645,473 | 7/1997 | Togawa et al. | 451/288 |
| 5,651,724 | 7/1997 | Kimura et al. | 451/288 |
| 5,653,624 | 8/1997 | Ishikawa et al. | 451/288 |
| 5,670,011 | 9/1997 | Togawa et al. | 451/288 |

FOREIGN PATENT DOCUMENTS 0 774 323 A2   5/1997   European Pat. Off. .

*Primary Examiner*—David A. Scherbel
*Assistant Examiner*—Derris H. Banks
*Attorney, Agent, or Firm*—Sixbey, Friedman, Leedom & Ferguson; David S. Safran

[57] ABSTRACT

A wafer mount plate is inserted loosely into a housing, and the wafer mount plate is supported in such a manner as to be swingable and movable vertically and horizontally with respect to a polishing pad. An air chamber is formed between the wafer mount plate and the housing. By controlling the internal pressure of the air chamber, it is possible to control polishing pressure applied on the wafer mount plate. Since the entire top side of the wafer mount plate can be uniformly pressured, the uniform polishing pressure can be applied on the entire surface of the semiconductor wafer. Further, the wafer mount plate inclines in accordance with variations in the inclination of the polishing pad so that the semiconductor wafer and the polishing pad can be maintained in a parallel position.

4 Claims, 1 Drawing Sheet

SEMICONDUCTOR WAFER POLISHING MACHINE

BACKGROUND OF THE INVENTION

1. Field of the Invention

The present invention relates generally to a semiconductor wafer polishing machine, and more particularly to a semiconductor wafer polishing machine which polishes a semiconductor wafer by controlling the polishing pressure.

2. Description of the Related Art

As semiconductor devices have recently become larger scale and consisted of multiple layers, it has become more important to accurately plane a semiconductor wafer in the process of manufacturing the semiconductor devices. To plane the semiconductor wafer, a polishing liquid is supplied to an area between the semiconductor wafer and polishing pad, and the semiconductor wafer and the polishing pad are moved relatively to each other and pressed against each other so that the semiconductor wafer can be polished.

In order to accurately polish the semiconductor wafer, pressure between the semiconductor wafer and the polishing pad (hereinafter referred to as polishing pressure) must be precisely controlled, and further, the semiconductor wafer and the polishing pad must be maintained in a parallel position.

In a conventional semiconductor wafer polishing machine, an air cylinder is used to apply the polishing pressure, and the polishing pressure is controlled by controlling the output of the air cylinder.

The air cylinder, however, has a disadvantage because it cannot precisely control its output, and the output is pulsating. For this reason, the polishing pressure cannot be precisely controlled in the above-mentioned machine.

There is another polishing machine which swings the semiconductor wafer in accordance with the inclination of the polishing pad by supporting a wafer mount plate via a spherical bearing so as to maintain the semiconductor wafer and the polishing pad in parallel to each other.

The spherical bearing, however, has a frictional resistance, and thus the wafer mount plate cannot move completely in accordance with variations in the inclination of the polishing pad in the above-mentioned machine. Further, the uniform polishing pressure cannot be applied on the whole surface of the semiconductor wafer to be polished. For this reason, the semiconductor wafer cannot be uniformly polished.

SUMMARY OF THE INVENTION

The present invention has been developed in view of the above-stated circumstances, and has as its object the provision of a semiconductor wafer polishing machine which is able to precisely control the polishing pressure and apply the uniform polishing pressure on the whole surface of the semiconductor wafer, and which is able to satisfactorily maintain the semiconductor wafer and the polishing pad in a parallel position.

To achieve the above-mentioned object, the semiconductor wafer polishing machine of the present invention, in which the semiconductor wafer and the polishing pad are moved relatively to each other and pressed against each other so that the semiconductor wafer can be polished, comprises: a wafer mount plate, which holds the semiconductor wafer facing the polishing pad; a housing, which holds the wafer mount plate having a play in the housing vertically to the polishing pad; a pressure chamber, which applies pressure on the side of the wafer mount plate which is opposite to the side holding the semiconductor wafer, and which is provided between the wafer mount plate and the housing and whose capacity and internal pressure are freely variable; and a pressure controlling means, which controls the internal pressure of the pressure chamber. Further, pressure between the semiconductor wafer and the polishing pad is controlled by controlling the internal pressure of the pressure chamber.

In the semiconductor wafer polishing machine of the present invention, the pressure chamber is provided between the wafer mount plate and the housing. The polishing pressure can be precisely controlled by controlling the internal pressure of the pressure chamber. The uniform polishing pressure can be applied on the whole surface of the semiconductor wafer.

Furthermore, in the present invention, the wafer mount plate is inserted loosely into the housing, so that the wafer mount plate can be supported in such a manner as to be swingable and vertically and horizontally movable with respect to the polishing pad. Thus, since the wafer mount plate inclines in accordance with variations in the inclination of the wafer mount plate, the semiconductor wafer and the polishing pad can be satisfactorily maintained in parallel to each other.

BRIEF DESCRIPTION OF THE DRAWINGS

The nature of this invention, as well as other objects and advantages thereof, will be explained in the following with reference to the accompanying drawing wherein.

DETAILED DESCRIPTION OF THE PREFERRED EMBODIMENTS

Figure 1:
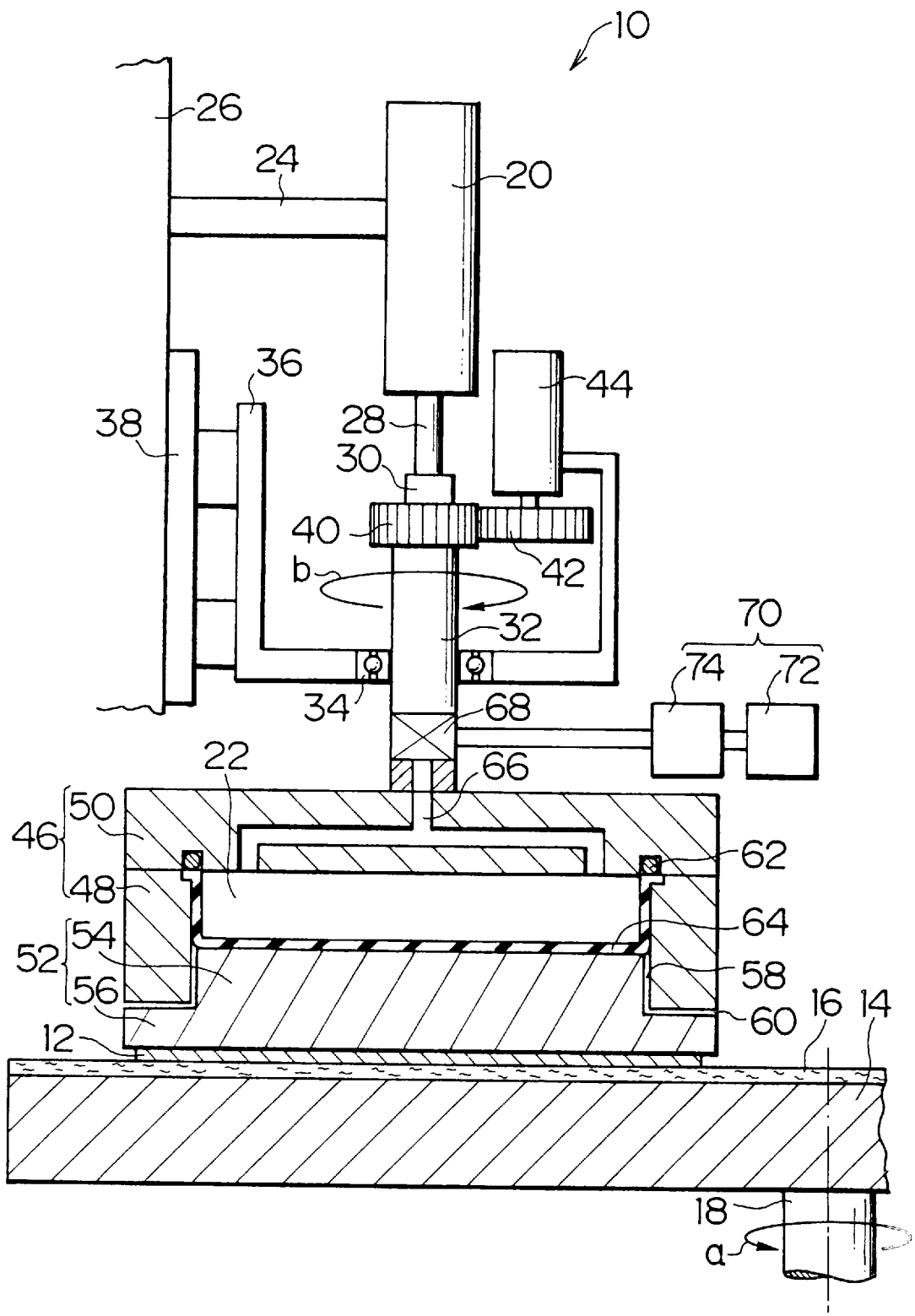
FIG. 1 is a sectional view illustrating the essential parts of a semiconductor wafer polishing machine according to an embodiment of the present invention.

This invention will be described in further detail by way of example with reference to the accompanying drawing.

FIG. 1 is a sectional view illustrating the essential parts of a semiconductor wafer polishing machine 10 according to an embodiment of the present invention. The semiconductor wafer polishing machine 10 polishes a semiconductor wafer 12 by pressing it against a polishing pad 16 on a turn table 14.

The turn table 14 is turned about a rotating shaft 18 by a driving gear (not shown) at a predetermined speed in the direction of an arrow (a) in FIG. 1. The polishing pad 16 is glued on the turn table 14. A polishing liquid is supplied from a nozzle (not shown) onto the polishing pad 16. The semiconductor wafer 12 is polished in a state of being pressed against the polishing pad 16 by a vertical feed device 20 and an air chamber 22.

The vertical feed device 20 is secured to a column 26 via an arm 24. A rod 28 of the vertical feed device 20 is moved up and down by a feed mechanism, which comprises a screw and a motor (not shown) inside the vertical feed device 20. A rotating shaft 32 is fixed to a bottom end of the rod 28 via a coupling 30, and the rotating shaft 32 is supported by a base 36 via a bearing 34. The base 36 is supported by the column 26 via a guide 38 and a linear bearing (not shown) in such a manner as to be vertically movable.

Thus, the rotating shaft 32 is vertically moved by the action of the vertical feed device 20. The rotating shaft 32 connects to a spindle of the motor 44, which is attached to the base 36, via gears 40, 42, and the rotating shaft 32 is rotated in the direction of an arrow (b) in FIG. 1 at a predetermined speed.

A housing 46 is secured to a bottom end of the rotating shaft 32, and the housing 46 supports a wafer mount plate 52 at a position opposite to the turn table 14. The housing 46 consists of a guide ring 48 and a disk base plate 50, and the wafer mount plate 52 consists of a columnar part 54 and a disk part 56. The bottom side of the disk part 56 holds the semiconductor wafer 12 by suitable holding means such as a vacuum chuck. On the other hand, the columnar part 54 is inserted into the guide ring 48, and a clearance 58 is formed between the outer peripheral surface of the columnar part 54 and the inner peripheral surface of the guide ring 48. A clearance 60 is formed between the top side of the disk part 56 and the bottom side of the guide ring 48.

Thus, the wafer mount plate 52 is movable vertically within the clearance 60 and horizontally within the clearance 58, and it is also swingable. Further, the columnar part 54 is anchored at the guide ring 48 by a falling prevention pin (not shown), and thus, the wafer mount plate 52 moves in accordance with the rotation and vertical movement of the housing 46.

On the other hand, an O-ring 62 and elastic film 64 are pinched between the base plate 50 and the guide ring 48, and the air chamber 22 as a pressure chamber is formed between the top side of the elastic film 64 and the bottom side of the base plate 50. An air supply passage 66 is formed in the base plate 50 and the rotating shaft 32, and the air supply passage 66 connects to the air chamber 22. The air supply passage 66 connects to an external pressure controller 70 via a rotary joint 68, which is provided within the rotating shaft 32. The pressure controller 70 consists of an air pump 72 and an air regulator 74, which supply the air of a desired pressure to the air chamber 22.

Thus, the pressure controller 70 supplies the air to the air chamber 22, and thereby the bottom side of the elastic film 64 comes into contact with the top side of the columnar part 54, and the pressure is applied to the wafer mount plate 52 downward in the drawing. The pressure is directly transmitted to the semiconductor wafer 12 so as to polish the wafer 12.

Next, an explanation will be given about the method of polishing the semiconductor wafer 12 with the semiconductor wafer polishing machine 10 which is constructed in the above-mentioned manner.

First, the semiconductor wafer 12 is mounted on the wafer mount plate 52 with its face to be polished down. Next, the vertical feed device 20 is activated to move the semiconductor wafer 12 closer to the polishing pad 16, and the pressure controller 70 is activated to pressure the air chamber 22, so that the semiconductor wafer 12 can be pressed against the polishing pad 16 by a predetermined polishing pressure. Then, the semiconductor wafer 12 and the polishing pad 16 are rotated while the polishing liquid is supplied from the nozzle (not shown) onto the polishing pad 16. Thereby, the semiconductor wafer 12 can be polished.

In this case, the pressure controller 70 controls the internal pressure of the air chamber 22 so that the polishing pressure can be precisely controlled.

Moreover, the wafer mount plate 52 is pressured via the air chamber 22, so that the entire top side of the wafer mount plate 52 can be uniformly pressured. Thus, the uniform polishing pressure can be applied on the whole surface of the semiconductor wafer 12.

Furthermore, the wafer mount plate 52 is supported in such a manner as to be swingable with respect to the housing 46, so that the wafer mount plate 52 can incline in accordance with the variations in the inclination of the polishing pad 16. Thereby, the semiconductor wafer 12 and the polishing pad 16 can be satisfactorily maintained in a parallel position. In this case, a range in which the wafer mount plate 52 can be inclined is restricted by the size of the clearances 58, 60. Thus, the wafer mount plate 52 is prevented from inclining excessively, and the edge of the semiconductor wafer 12 does not bite into the polishing pad 16.

During the polishing, the number of rotations of the semiconductor wafer 12 and the polishing pad 16 are equal, and they are rotated in the opposite directions. Thereby, the moving distance to the polishing pad 16 can be equal over the whole surface of the semiconductor wafer 12, so that the semiconductor wafer 12 can be uniformly polished.

Next, an explanation will be given about the taking-up of the polished semiconductor wafers. In a conventional semiconductor wafer polishing machine which applies the polishing pressure to the semiconductor wafer by making an air bag, etc. contact with the semiconductor wafer, the semiconductor wafer is merely deposited on the polishing pad, and thus, the semiconductor wafers cannot be automatically taken up. To the contrary, in the semiconductor wafer polishing machine 10 of the present invention, the wafer mount plate 52 holds the semiconductor wafer 12, so that the polished semiconductor wafers can be automatically taken up.

In the semiconductor wafer polishing machine of this embodiment, the air is used as the pressure medium for controlling the internal pressure of the pressure chamber; however, the present invention should not be restricted to this. Other gaseous body and liquid may be used as the pressure medium.

The vertical feed device 20 may vertically move the semiconductor wafer 12 to assist the controlling of the polishing pressure.

As set forth hereinabove, the semiconductor wafer polishing machine according to the present invention is able to precisely control the polishing pressure, and apply the uniform polishing pressure on the whole surface of the semiconductor wafer. In addition, the semiconductor wafer and the polishing pad can be satisfactorily maintained in parallel to each other.

It should be understood, however, that there is no intention to limit the invention to the specific forms disclosed, but on the contrary, the invention is to cover all modifications, alternate constructions and equivalents falling within the spirit and scope of the invention as expressed in the appended claims.

We claim:

1. A semiconductor wafer polishing machine in which a semiconductor wafer and a polishing pad are moved relative to each other and are pressed against each other so as to polish said semiconductor wafer, said semiconductor wafer polishing machine comprising:

a wafer mounting plate having a disk part which faces said polishing pad for holding said semiconductor wafer, and a columnar part extending from said disk part in a direction away from said polishing pad;

a housing for holding the wafer mounting plate, said housing having an opening in which the columnar part of the wafer mounting plate is received with play existing between the housing and both the columnar part and the disk part;

an elastic film having a recessed shape in which an open end of the recess faces away from the wafer mounting plate, said elastic film being disposed in said opening at an opposite side of said columnar part of the wafer mounting plate relative to the disk part, an outer side of the elastic film extending across the columnar part of the wafer mounting plate at a bottom end of the recess and an inner side of the elastic film forming a variable pressure chamber within the opening of the housing; and pressure control means for varying the pressure within the pressure chamber, said pressure acting on the semiconductor wafer via said elastic film and wafer mounting plate, said wafer mounting plate being inclinable in accordance with variations in inclination of the polishing pad due to the play existing between the housing and both the columnar part and the disk part of the wafer mounting plate.

2. The semiconductor wafer polishing machine as defined in claim 1, wherein a gaseous pressure medium is provided for controlling the pressure within said variable pressure chamber.

3. The semiconductor wafer polishing machine as defined in claim 1, wherein a liquid pressure medium is provided for controlling the pressure within said variable pressure chamber.

4. The semiconductor wafer polishing machine as defined in claim 1, further comprising moving means for moving said housing to and from said polishing pad; and wherein said moving means moves said housing to and from said polishing pad, thereby assisting the controlling of the pressure between said semiconductor wafer and said polishing pad.

* * * * *